US012142530B2

(12) United States Patent
Wu et al.

(10) Patent No.: US 12,142,530 B2
(45) Date of Patent: Nov. 12, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chung-Chiang Wu, Taichung (TW); Hung-Chin Chung, Pingzhen (TW); Hsien-Ming Lee, Changhua (TW); Chien-Hao Chen, Chuangwei Township (TW); Ching-Hwanq Su, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 536 days.

(21) Appl. No.: 17/365,057

(22) Filed: Jul. 1, 2021

(65) Prior Publication Data

US 2021/0327761 A1    Oct. 21, 2021

Related U.S. Application Data

(63) Continuation of application No. 16/549,195, filed on Aug. 23, 2019, now Pat. No. 11,056,395.

(51) Int. Cl.
*H01L 21/8234* (2006.01)
*H01L 27/088* (2006.01)

(52) U.S. Cl.
CPC ............ *H01L 21/82345* (2013.01); *H01L 21/823456* (2013.01); *H01L 27/0886* (2013.01)

(58) Field of Classification Search
None
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 10,049,940 B1 | 8/2018 | Chen et al. |
| 2014/0282326 A1 | 9/2014 | Chen et al. |
| 2014/0363960 A1 | 12/2014 | Kim et al. |
| 2015/0126023 A1 | 5/2015 | Choi et al. |
| 2016/0225867 A1 | 8/2016 | Kim |
| 2016/0268259 A1 | 9/2016 | Chang et al. |
| 2016/0351569 A1* | 12/2016 | Song ............ H01L 29/4966 |
| 2017/0110553 A1* | 4/2017 | Zhou ............ H01L 21/823821 |
| 2018/0082908 A1* | 3/2018 | Yeh ............ H01L 27/1211 |

* cited by examiner

*Primary Examiner* — Evren Seven
*Assistant Examiner* — Cole Leon Lindsey
(74) *Attorney, Agent, or Firm* — Slater Matsil, LLP

(57) ABSTRACT

Semiconductor devices and methods of manufacturing semiconductor devices with differing threshold voltages are provided. In embodiments the threshold voltages of individual semiconductor devices are tuned through the removal and placement of differing materials within each of the individual gate stacks within a replacement gate process, whereby the removal and placement helps keep the overall process window for a fill material large enough to allow for a complete fill.

20 Claims, 9 Drawing Sheets

SEMICONDUCTOR DEVICE AND METHOD OF MANUFACTURE

PRIORITY CLAIM AND CROSS-REFERENCE

This patent is a continuation of U.S. application Ser. No. 16/549,195, filed on Aug. 23, 2019, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
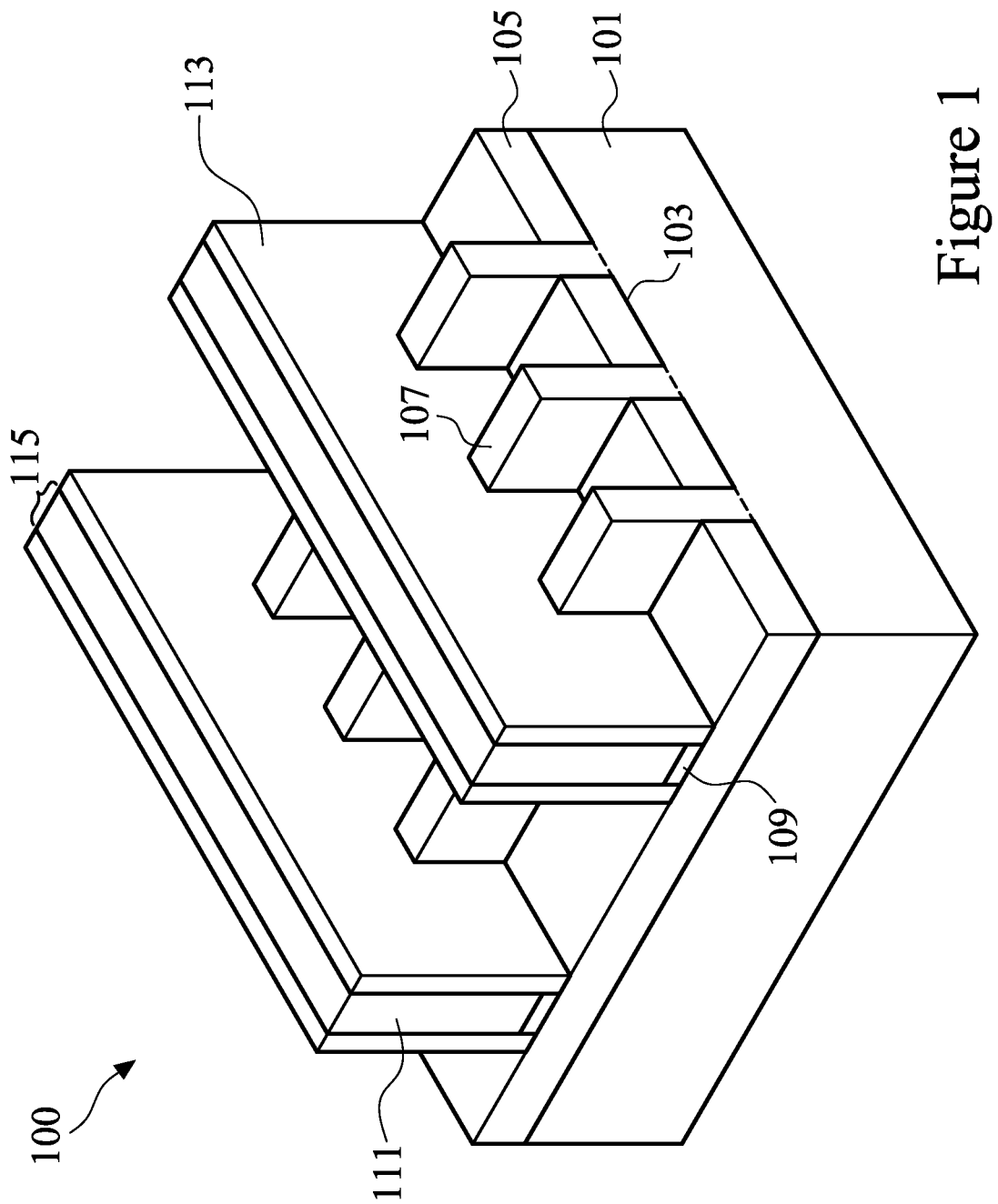
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including fin field effect transistor (finFET) devices with multiple threshold voltages for 5 nm or 3 nm technology nodes. However, embodiments are not limited to the examples provided herein, and the ideas may be implemented in a wide array of embodiments.

Embodiments provide the ability to achieve different threshold voltages for different transistor devices. Rather than simply depositing additional work function layers to achieve different threshold voltages for some transistors, a thin capping layer is provided between work function layers (for example, between a p-type work function layer and an n-type work function layer). The thin capping layer may be a silicon oxide or silicon nitride layer. The capping layer provides a varying threshold voltage at a thickness which may be between 10% and 80% the thickness of the underlying work function layer, which in turn allows for a greater available width for a subsequently deposited metal fill. This enhances the critical dimension window for forming the metal fill.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2:
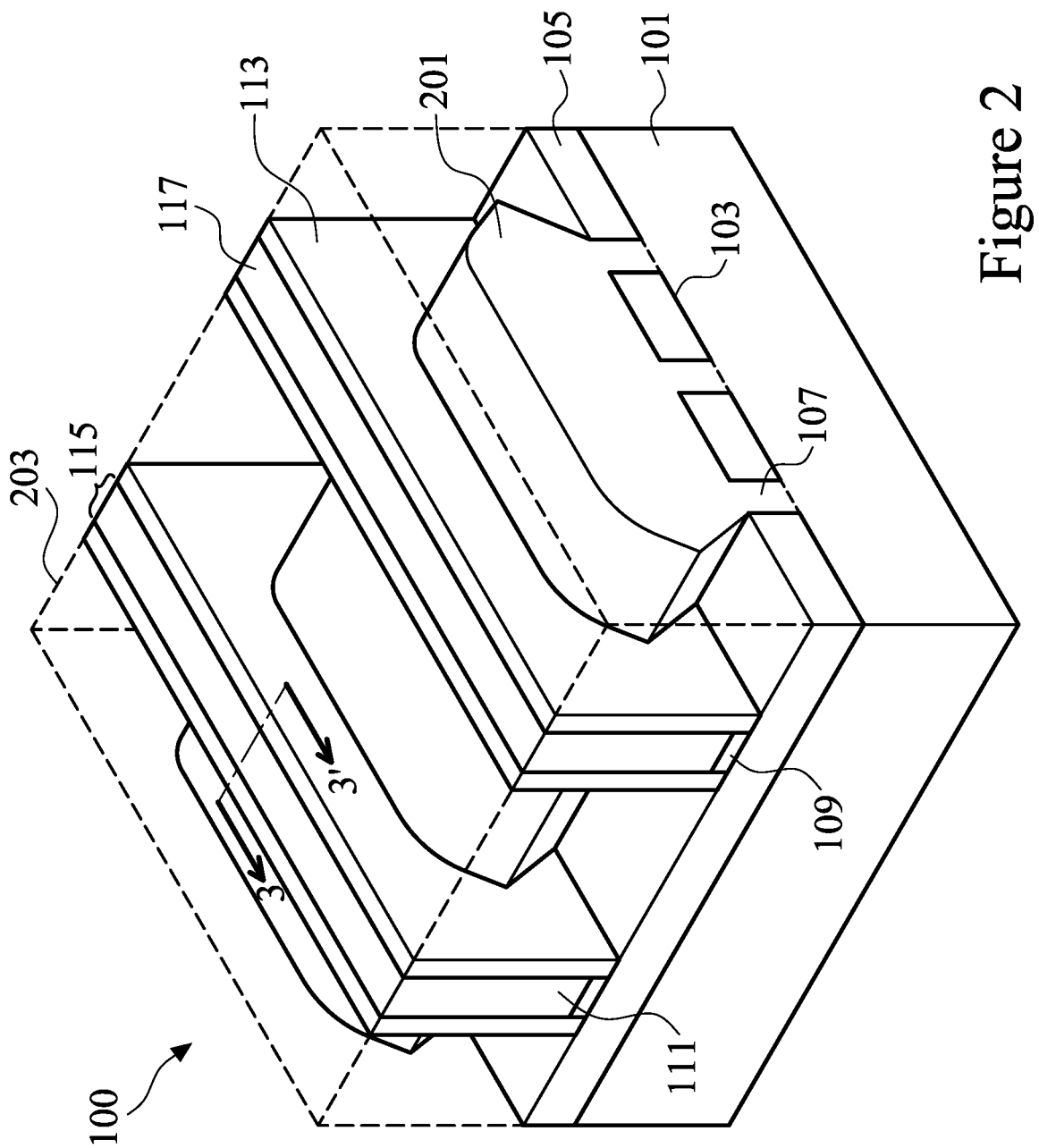
FIG. 2 illustrates formation of source/drain regions, in accordance with some embodiments.

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2 also illustrates a formation of an inter-layer dielectric (ILD) layer 203 (illustrated in dashed lines in FIG. 2 in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

Figure 3:
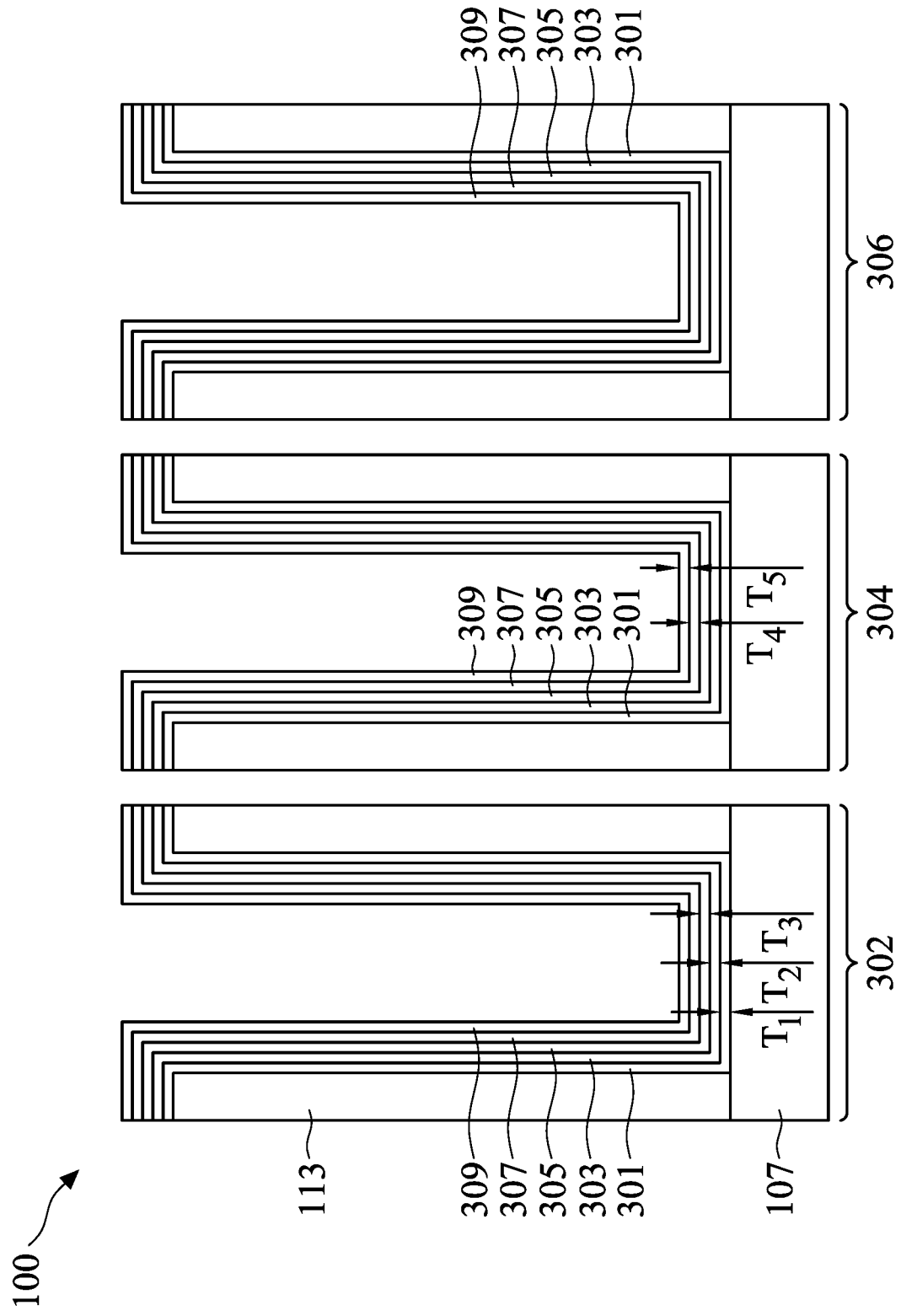
FIG. 3 illustrates formation of materials for a gate stack, in accordance with some embodiments.

FIG. 3 illustrates a cross-sectional view of FIG. 2 along line 3-3' in order to better illustrate a removal and replacement of the material of the dummy gate electrode 111 and the dummy gate dielectric 109 with a plurality of layers for a first gate stack 902 (not illustrated in FIG. 3 but illustrated and described below with respect to FIG. 9). Additionally in FIG. 3, while the first gate stack 902 is illustrated as being within a first region 302 of the substrate 101, there is also illustrated a second region 304 (for a second gate stack 904) of the substrate 101, and a third region 306 (for a third gate stack 906) of the substrate 101. In an embodiment, the first gate stack 902 may be a gate stack for a first transistor 903 (e.g., a first PMOS finFET transistor) with a first voltage threshold $V_{t1}$ while the second gate stack 904 may be for a second transistor 905 (e.g., a second PMOS finFET transistor) with a second voltage threshold $V_{t2}$ different from the first voltage threshold $V_{t1}$. Additionally, the third gate stack 906 may be for a third transistor 907 (e.g., a third PMOS finFET transistor) with a third voltage threshold $V_{t3}$. However, any suitable devices may be utilized (e.g., including NMOS finFET transistors).

In an embodiment the dummy gate electrode 111 and the dummy gate dielectric 109 may be removed using, e.g., one or more wet or dry etching processes that utilize etchants that are selective to the material of the dummy gate electrode 111 and the dummy gate dielectric 109. However, any suitable removal process or processes may be utilized.

Once the dummy gate electrode 111 and the dummy gate dielectric 109 have been removed, a process to form the first gate stack 902, the second gate stack 904, and the third gate stack 906 may be begun by depositing a series of layers. In an embodiment the series of layers may include an interfacial layer 301, a first dielectric material 303, a first metal material 305, a first p-metal work function layer 307, and a first capping layer 309.

Optionally, the interfacial layer 301 may be formed prior to the formation of the first dielectric material 303. In an embodiment the interfacial layer 301 may be a material such as silicon dioxide formed through a process such as in situ steam generation (ISSG). In another embodiment the interfacial layer 301 may be a high-k material such as $HfO_2$, HfSiO, HfSiON, HfTaO, HfTiO, HfZrO, LaO, ZrO, $Ta_2O_5$, combinations of these, or the like, conformally deposited to a first thickness $T_1$ of between about 5 Å and about 20 Å, such as about 10 Å. However, any suitable material or process of formation may be utilized.

Once the interfacial layer 301 is formed, the first dielectric material 303 may be formed as a capping layer over the interfacial layer 301. In an embodiment the first dielectric material 303 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 303 may be deposited to a second thickness $T_2$ of between about 5 Å and about 200 Å, although any suitable material and thickness may be utilized.

The first metal material 305 may be formed adjacent to the first dielectric material 303 as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 305 may be deposited using a deposition process such as atomic layer deposition, chemical vapor deposition, sputtering, or the like, to a third thickness $T_3$ of between about 5 Å and about 200 Å, although any suitable deposition process or thickness may be used.

The first p-metal work function layer 307 may be formed adjacent to the first metal material 305. In particular embodiments, the material of the first p-metal work function layer 307 may be a tungsten based metal like tungsten, tungsten nitride (WNx), tungsten carbide nitride (WCxNy), tungsten oxide (WOx), combinations of these, or the like. In another embodiment the first p-metal work function layer 307 may be a molybdenum based metal such as molybdenum, molybdenum nitride (MoNx), combinations of these, or the like. In still another embodiment the first p-metal work function layer 307 may be a material such as titanium nitride (TiN). In yet another embodiment the first p-metal work function layer 307 may be a material such as gold, platinum, palladium, combinations of these, or the like. However, any suitable material may be utilized. Additionally, the first p-metal work function layer 307 may be deposited using a deposition process such as atomic layer deposition, chemical vapor deposition, sputtering, or the like, to a fourth thickness $T_4$ of between about 5 Å and about 200 Å, although any suitable deposition process or thickness may be used.

The first capping layer 309 may be formed adjacent to the first p-metal work function layer 307 and may protect the first p-metal work function layer 307 from oxidation. The first capping layer 309 may be an insulating layer, such as a dielectric material, including silicon oxide or silicon nitride, or the like. The first capping layer 309 may be formed by an in-situ process by soaking a silicon based gas on top of the first p-metal work function layer 307, to a fifth thickness $T_5$ of between about 1 Å and about 20 Å, or between about 5 Å and about 20 Å, although any suitable deposition process or thickness may be used. One advantage of using the first capping layer 309 rather than an additional p-metal work function layer is that the first capping layer 309 exhibits effective threshold voltage tuning with a thinner layer, allowing for greater space in which to deposit a subsequently formed metal fill. For example, in some embodiments, the fifth thickness $T_5$ of the first capping layer 309 may be less than half the fourth thickness $T_4$ of the first p-metal work function layer 307. The fifth thickness T5 may be between about 10% and 80% of the fourth thickness T4.

In some embodiments, the in-situ soak process may utilize precursors used to form the first capping layer 309, including silane ($SiH_4$), dichlorosilane (DCS) ($H_2SiCl_2$), disilane (DS) ($Si_2H_6$), trichlorosilane (TCS) ($HSiCl_3$), or the like. During the soak process, the semiconductor device 100 is heated to a temperature above the condensation temperature but below the thermal decomposition temperature of a reactant agent (e.g., Si-based precursor). The semiconductor device 100 is then exposed, soaked, or immersed in the reactant agent so that the reactant is adsorbed on the surface of the first p-metal work function layer 307 of the FET in the first region 302, the second region 304, and the third region 306. The reactant forms a layer or monolayer of the reactant (e.g., Si monolayer) on the exposed surfaces. In some embodiments, a thin monolayer metal-silicide may be formed at the interface of the first capping layer 309 and the first p-metal work function layer 307. In some embodiments, the semiconductor device 100 is then exposed to air or oxidants to allow spontaneous formation of a silicon oxide layer corresponding to the first capping layer 309. In another embodiment, a CVD process (e.g., CVD, LPCVD, PECVD) or other suitable process may be used to combine a silicon-based precursor with a nitrogen-based precursor to form a silicon nitride layer corresponding to the first capping layer.

In one example, a layer of silicon oxide is formed on the first p-metal work function layer 307 in the first region 302, the second region 304, and the third region 306 by a soak process. The soak process begins with setting the temperature of the semiconductor device 100 in a process chamber to a temperature range of about 300° C. to about 500° C., for example about 350° C. to about 450° C. A silicon-based precursor, such as any of the silanes or disilanes described above, is introduced into the process chamber so that the semiconductor device 100 is soaked or immersed in the silicon-based precursor. The silanes or disilanes may be flowed into the process chamber at a flow rate of about 10 sccm to about 1000 sccm, such as about 50 sccm to about 600 sccm, for example about 50 sccm to about 400 sccm. The semiconductor device 100 may be soaked or immersed in the silanes or disilanes for about 10 second to about 300 seconds to form a layer of silicon on the surface of the first p-metal work function layer 307. In general, a longer soak in the silanes or disilanes produces a thicker silicon layer until saturation has occurred, after which the thickness of the silicon layer ceases to increase or increases minimally with additional time. A soak in the silanes or disilanes at a higher growth temperature also produces a thicker silicon layer. The time and temperature of the soak can be adjusted to obtain a desired thickness of the silicon layer. In some cases, the semiconductor device 100 is soaked in the silanes or disilanes for about 10 seconds to about 180 seconds. In some cases, the semiconductor device 100 is soaked in the silanes or disilanes for about 5 seconds to about 100 seconds. In some cases, the semiconductor device 100 is soaked in the silanes or disilanes for about 30 seconds to about 120 seconds. In one embodiment, the semiconductor device 100 is soaked in the silane ($SiH_4$) for about 15 seconds to about 120 seconds. In another embodiment, the semiconductor device 201 is soaked in the disilane ($Si_2H_6$) for about 15 seconds to about 100 seconds. The layer of silicon may have a thickness of about 2 Å to about 10 Å, for example about 3 Å to about 7 Å. One of skill in the art will understand however, that these thicknesses are merely examples, and other thicknesses may be utilized as appropriate.

After the silanes or disilanes have adsorbed on the surface of the p-metal work function layer 307 in the first region 302, the second region 304, and the third region 306, the flow of the silanes or disilanes to the process chamber is interrupted or impeded. The vacuum of the process chamber is broken, introducing an oxidant, such as oxygen, to the silicon, resulting in spontaneous conversion of the silicon to a layer of silicon oxide. The introduction of oxygen causes the thickness of the layer to increase as the oxygen is incorporated into the silicon. In some embodiments, all of the silicon layer may be converted into a silicon oxide layer, while in other embodiments, for example where the silicon layer is too thick for the oxygen to fully penetrate, a lower portion of the silicon layer may remain unconverted. In such embodiments, an interface between the lower silicon portion and the upper silicon oxide portion may include an area where there is a gradient of oxygen concentration as the first capping layer 309 transitions from silicon oxide to silicon.

In some embodiments, the soak process and vacuum break can be repeated until a desired thickness of the first capping layer 309 is reached. The resulting first capping layer 309 may comprise silicon oxide or both silicon and silicon oxide, for example in alternating layers of silicon and silicon oxide. The resulting first capping layer 309 may have a thickness of about 3 Å to about 15 Å, for example about 3 Å to about 10 Å. One of skill in the art will understand however, that these thicknesses are merely examples, and other thicknesses may be utilized as appropriate. The semiconductor device 100 may then be transferred to another process chamber for the subsequent deposition of a metal layer.

Alternatively or additionally, two or more reactant agents may be used to produce the silicon oxide. In such a case, the semiconductor device 100 is exposed alternately and subsequently to pulses of two or more reactant agents, which pulses may be separated from each other by evacuation and/or purging of the process chamber. In some cases, after the adsorption of a monolayer of a first reactant agent (e.g., Si-based precursor) on the surfaces of the exposed p-metal work function layer 307 in the first region 302, the second region 304, and the third region 306, the semiconductor device 100 is exposed to a second reactant (e.g., vapor phase $H_2O$ or other oxidants). During exposure with the second reactant, the second reactant adsorbs on and reacts with available molecules of the first reactant to form silicon oxide on a monolayer scale. This process may be repeated so that the surface layer is grown monolayer by monolayer until a desired thickness is reached. Other suitable processes may be used.

In another example, a layer of silicon nitride is formed on the first p-metal work function layer 307 in the first region 302, the second region 304, and the third region 306 by an in-situ process using a combination of any of the silanes or disilanes described above and a second precursor that is nitrogen based, such as ammonia ($NH_3$) or other suitable material. For example silane ($SiH_4$) may be combined with ammonia to produce silicon nitride ($Si_3N_4$) and hydrogen ($H_2$) byproduct. In such embodiments, after the silanes or disilanes have been flowed into the process chamber and allowed to adsorb onto the first p-metal work function layer 307 (such as described above with respect to the silicon oxide layer formation), ammonia may be flowed into the process chamber at a flow rate of between about 100 sccm to about 10,00 sccm, such as about 450 sccm, for about 30 seconds at a temperature of between about 350° C. and about 500° C. However, as one of ordinary skill in the art will recognize, these process conditions are only intended to be illustrative, as any suitable process conditions may be utilized to introduce the second precursor material while remaining within the scope of the embodiments. It should also be understood that any suitable materials and processes may be used to form the silicon nitride layer. The process may be repeated a number of times to form a desired thickness of the silicon nitride layer.

In a later process, described in further detail below, the first capping layer 309 may be removed from the first region 302 and the second region 304 to provide a differentiation between these regions and the third region 306 to provide the threshold voltage $V_{t3}$ different from $V_{t1}$ and $V_{t2}$.

Figure 4:
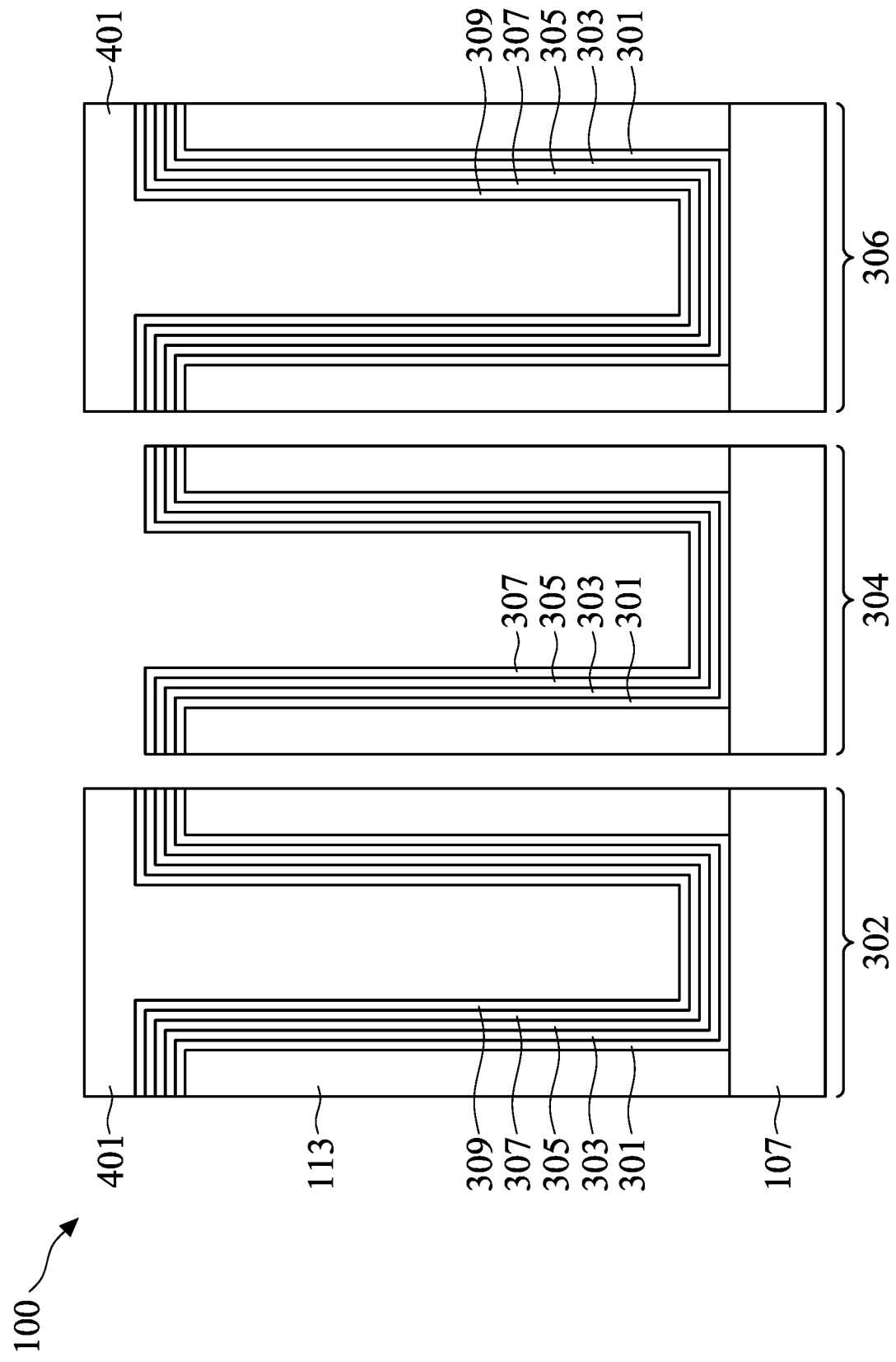
FIG. 4 illustrates a removal process of a first capping layer, in accordance with some embodiments.

FIG. 4 illustrates a removal of the first capping layer 309 from the second region 304 but not from the first region 302 and the third region 306. In an embodiment the removal may be initiated by placing a first photoresist 401 over the first region 302, the second region 304, and the third region 306. Once in place the first photoresist 401 may then be patterned to expose the second region 304 without exposing the first region 302 and the third region 306. The patterning may be performed by exposing the first photoresist 401 to a patterned energy source in order to modify the physical properties of the first photoresist 401, and then applying a developer in order to remove that portion of the first photoresist 401 over the second region 304 while leaving the first photoresist 401 to protect the first region 302 and the third region 306.

Once the first capping layer 309 has been exposed in the second region 304, the first capping layer 309 in the second region 304 may be removed. In an embodiment the first capping layer 309 may be removed in the second region 304 utilizing one or more etching process, such as a wet etching process or a dry etching process that is selective to the material of the first capping layer 309 (e.g., silicon dioxide) and which stops without significantly removing the material of the first p-metal work function layer 307 (e.g., tungsten nitride). However, any suitable removal process may be utilized.

Figure 5:
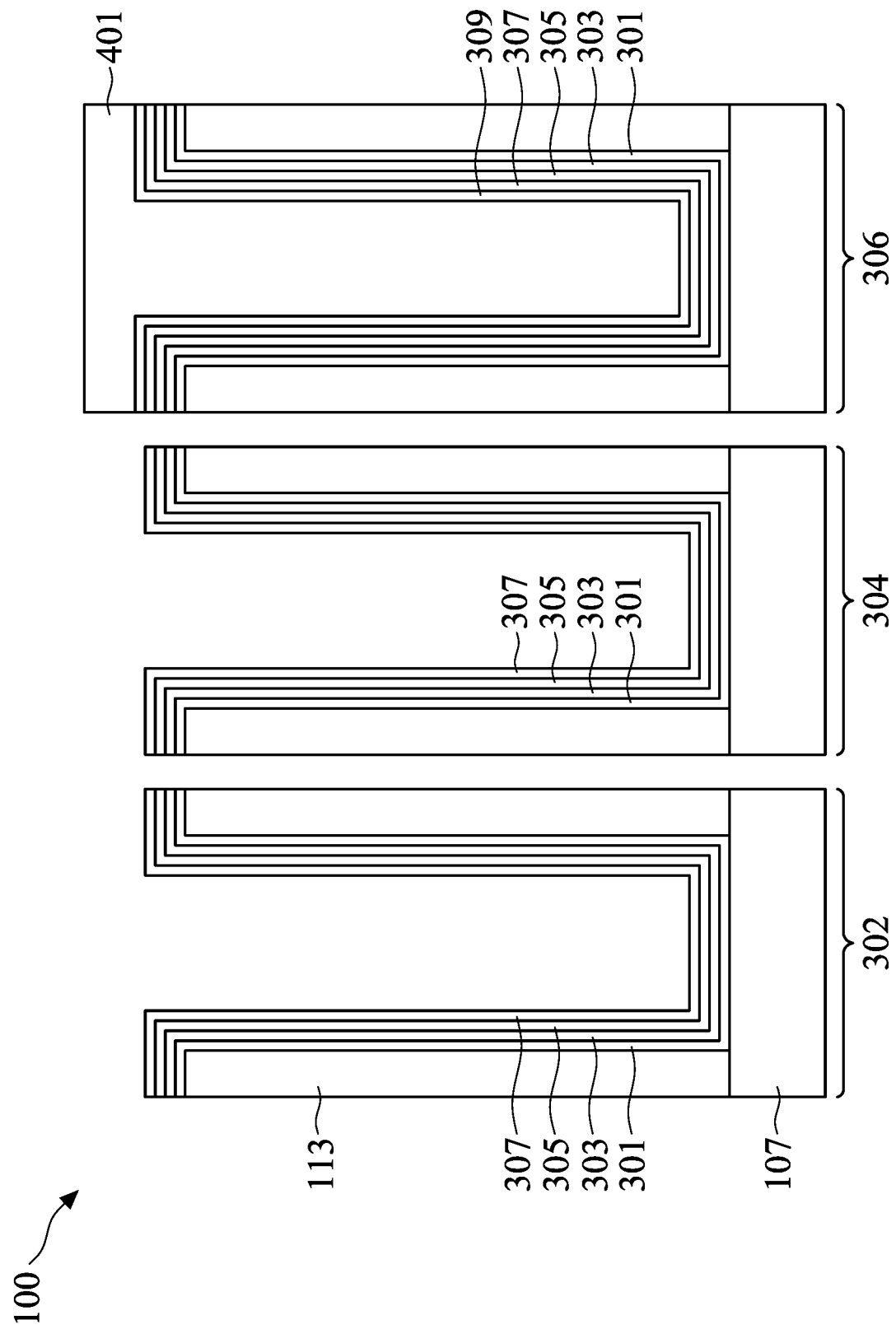
FIG. 5 illustrates another removal process of a first capping layer, in accordance with some embodiments.

FIG. 5 illustrates a removal of the first capping layer 309 from the first region 302 and the second region 304 but not from the third region 306, in accordance with some embodiments. Rather than remove the first capping layer 309 from only the second region 304, as illustrated above in FIG. 4, the first capping layer 309 may also be removed from the first region 302. The first capping layer 309 may be removed from the first region 302 using processes and materials similar to those described above with respect to the removal of the first capping layer 309 from the second region 304. The first capping layer 309 may be removed from the first region 302 in the same process or in separate processes as the removal of the first capping layer 309 in the second region 304. For example, if removed in the same process as the removal of the first capping layer 309 in the second region 304, the first photoresist 401 may be patterned to expose the first capping layer 309 in the first region 302 at the same time as exposing the first capping layer 309 in the second region 304. Then, the first capping layer 309 may be removed in both the first region 302 and the second region 304 in the same removal process.

Figure 6:
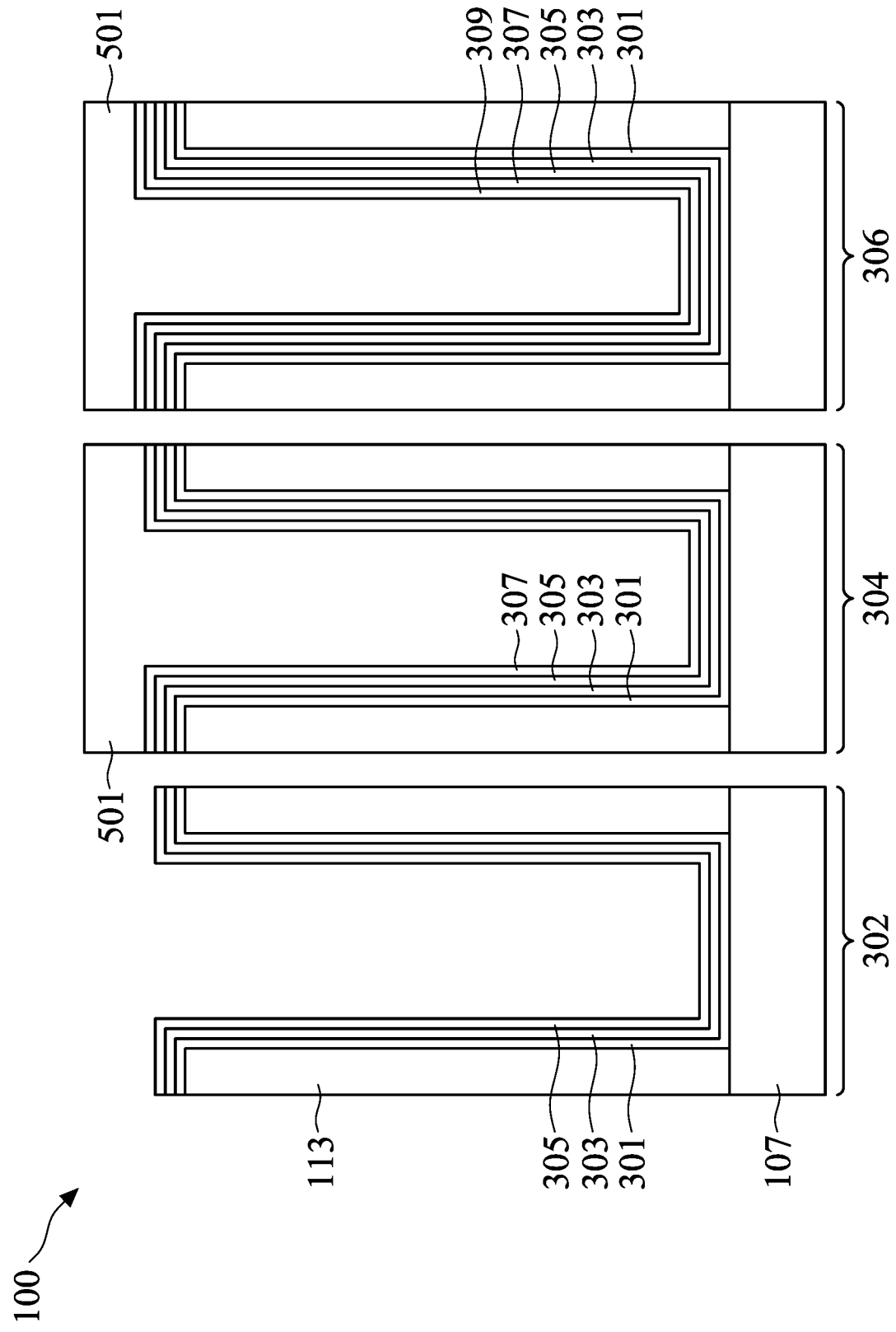
FIG. 6 illustrates a removal process of a first p-metal work function layer, in accordance with some embodiments.

FIG. 6 illustrates that, once the first capping layer 309 has been removed in the second region 304, the first photoresist 401 may be removed from over the first region 302 (if applicable) and the third region 306. In an embodiment the first photoresist 401 may be removed using a process such as ashing, whereby a temperature of the first photoresist 401 is increased until the first photoresist 401 experiences a thermal decomposition and can then be removed. However, any other suitable process may be utilized in order to remove the first photoresist 401.

FIG. 6 additionally illustrates that, once the first photoresist 401 has been removed, the first capping layer 309 (if applicable, as illustrated in FIG. 4) and the first p-metal work function layer 307 are removed from the first region 302. In an embodiment the removal may be initiated by placing a second photoresist 501 over the first region 302, the second region 304, and the third region 306. Once in place the second photoresist 501 may then be patterned to expose the first region 302 without exposing the second region 304 and the third region 306. The patterning may be performed by exposing the second photoresist 501 to a patterned energy source in order to modify the physical properties of the second photoresist 501, and then applying a developer in order to remove that portion of the second photoresist 501 over the first region 302 while leaving the second photoresist 501 to protect the second region 304 and the third region 306.

If the first capping layer 309 is not yet removed in the first region 302 (as illustrated in FIG. 4), once the first capping layer 309 has been exposed in the first region 302, the first capping layer 309 in the first region 302 may be removed. In an embodiment the first capping layer 309 may be removed in the first region 302 using processes and materials similar to those described above with respect to the removal of the first capping layer 309 in the second region 304 in FIG. 4. In another embodiment, the first capping layer 309 may be removed in the first region 302 utilizing one or more etching process, such as a wet etching process or a dry etching process that is selective to the material of the first capping layer 309 or the material of the first p-metal work function layer 307 and which stops without significantly removing the material of the first metal material 305 (e.g., tantalum nitride). However, any suitable removal process may be utilized.

If the first capping layer 309 has already been removed in the first region 302 (as illustrated in FIG. 5), once the first p-metal work function layer 307 has been exposed in the first region 302, the first p-metal work function layer 307 in the first region 302 may be removed. In an embodiment the first p-metal work function layer 307 may be removed in the first region 302 utilizing one or more etching process, such as a wet etching process or a dry etching process that is selective to the material of the first p-metal work function layer 307 and which stops without significantly removing the material of the first metal material 305. However, any suitable removal process may be utilized. In one embodiment in which the first p-metal work function layer 307 is patterned using a wet etch process with a wet etchant such as $NH_4OH$, ozonated deionized water ($DI-O_3$), or other suitable etchant, and in which the first metal material 305 is tantalum nitride, the material of the first p-metal work function layer 307 may have a selectivity larger than about 500. However, any suitable selectivity may be utilized.

Figure 7:
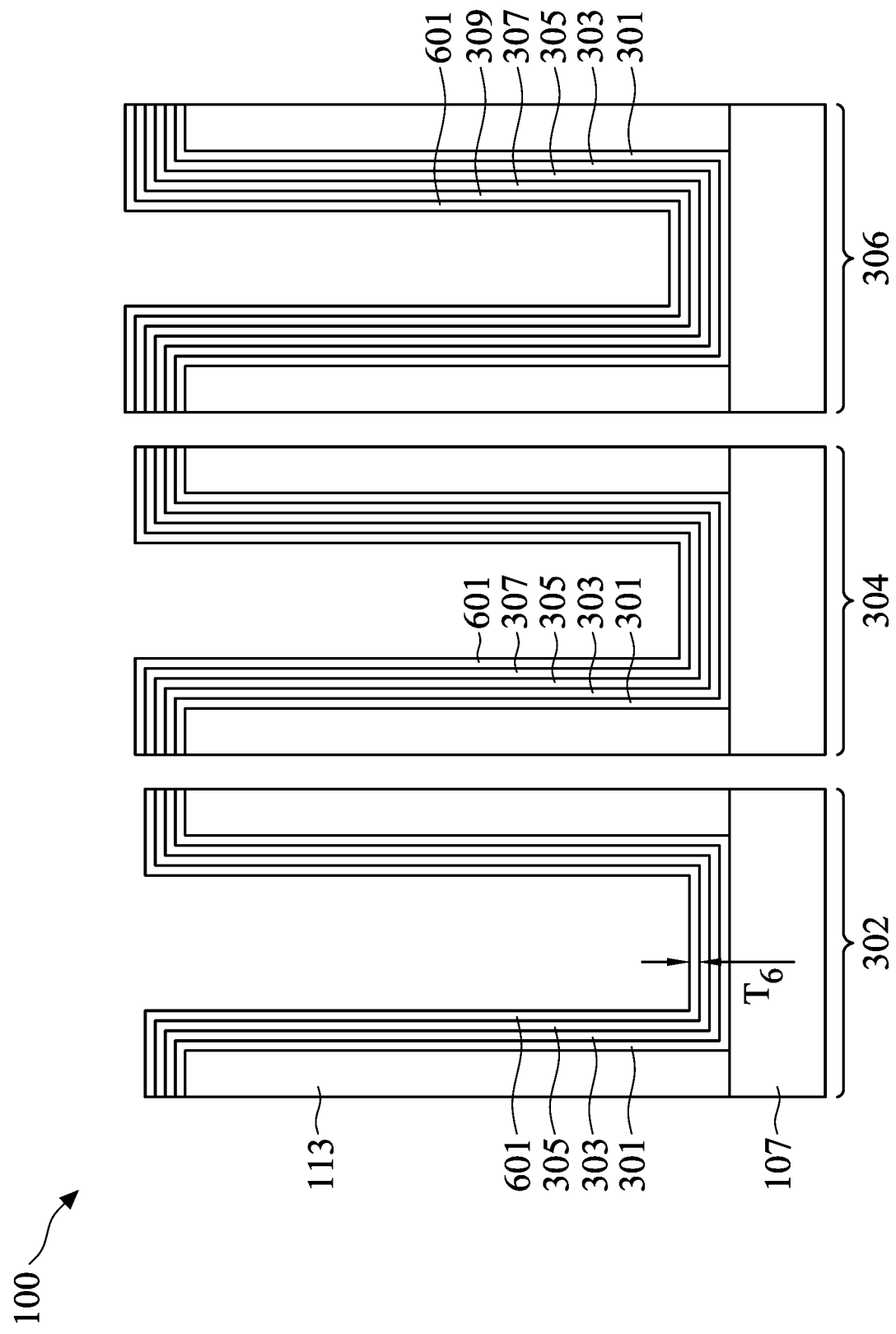
FIG. 7 illustrates a deposition of a first n-metal work function layer, in accordance with some embodiments.

FIG. 7 illustrates that, once the first p-metal work function layer 307 has been removed from the first region 302, the second photoresist 501 may be removed from over the second region 304 and the third region 306. In an embodiment the second photoresist 501 may be removed using a process such as ashing, whereby a temperature of the second photoresist 501 is increased until the second photoresist 501 experiences a thermal decomposition and can then be removed. However, any other suitable process may be utilized in order to remove the second photoresist 501.

FIG. 7 additionally illustrates a deposition of a first n-metal work function layer 601 in each of the first region 302, the second region 304, and the third region 306. In an embodiment the first n-metal work function layer 601 may be a material such as Ti, Ag, Al, TaAl, TaAlC, TiAlN, TaC, TaCN, TaSiN, Mn, Zr, other suitable n-type work function materials, or combinations thereof. For example, the first n-metal work function layer 601 may be deposited utilizing an atomic layer deposition (ALD) process, CVD process, or the like, to a sixth thickness T6 of between about 20 Å and about 50 Å, such as about 30 Å. However, any suitable materials and processes may be utilized to form the first n-metal work function layer 601.

Figure 8:
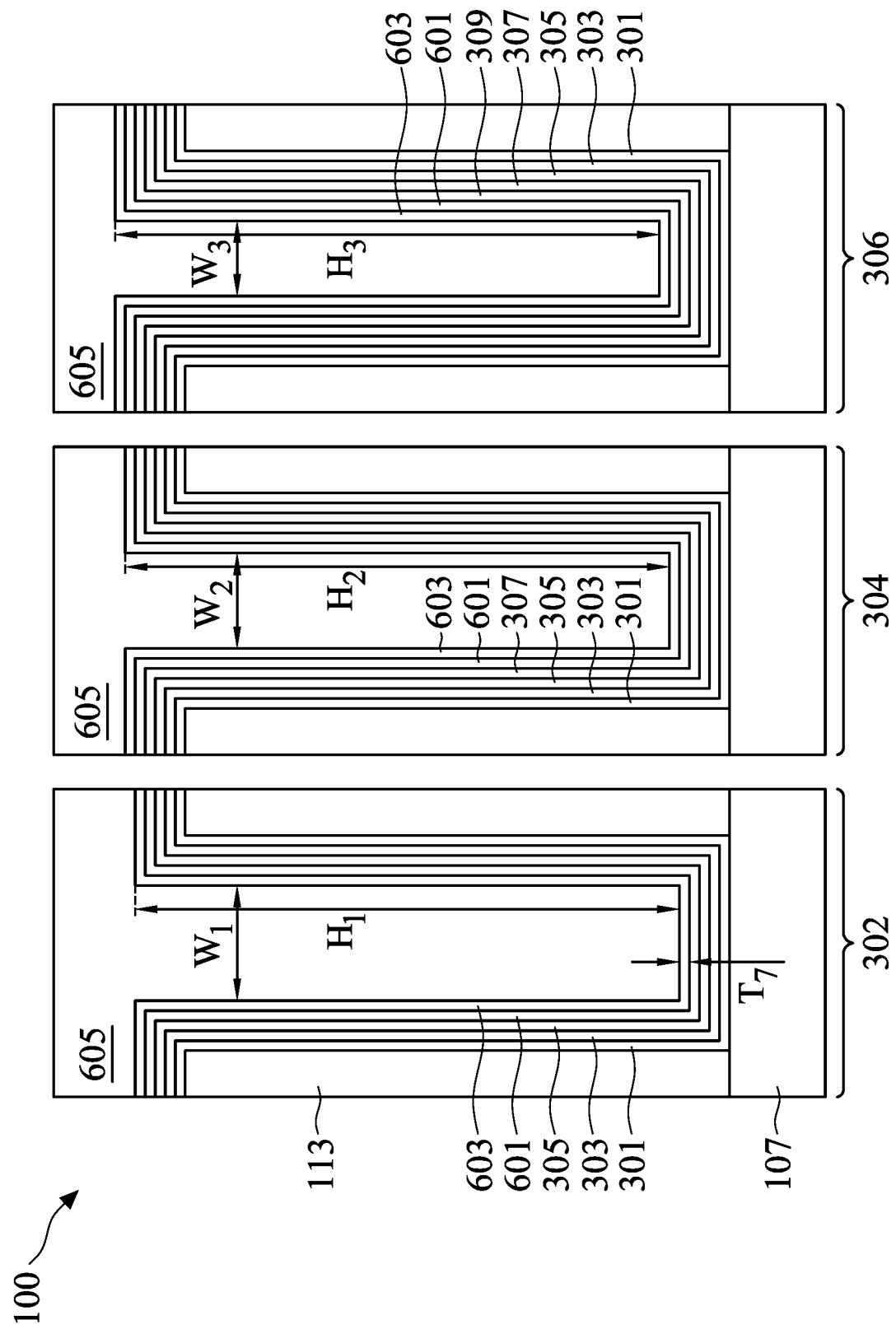
FIG. 8 illustrates a deposition of a fill material, in accordance with some embodiments.

FIG. 8 illustrates the deposition of a glue layer 603 and a fill material 605. Once the first n-metal work function layer 601 has been formed, the glue layer 603 may formed in order to help adhere the overlying fill material 605 with the underlying first n-metal work function layer 603 as well as provide a nucleation layer for the formation of the fill material 605. In an embodiment the glue layer 603 may be a material such as titanium nitride or else may be a material similar to the first n-metal work function layer 601 and may be formed using a similar process such as ALD to a seventh thickness $T_7$ of between about 10 Å and about 100 Å, such as about 50 Å. However, any suitable materials and processes may be utilized.

Once the glue layer 603 has been formed, the fill material 605 is deposited to fill a remainder of the opening using the glue layer 603. However, by utilizing the first capping layer 309 instead of simply depositing additional layers of the first p-metal work function layer 307, a thinner layer is utilized in order to obtain the desired tuning of the threshold voltages (further described below), and the widths that will be filled by the subsequently deposited fill material 605 remain larger than otherwise. For example, in the first region 302 the remainder of the opening after deposition of the glue layer 603 may have a first width $W_1$ of between about 10 Å and about 50 Å, such as about 30 Å. Similarly, in the second region 304 the remainder of the opening after deposition of the glue layer 603 may have a second width $W_2$ of between about 10 Å and about 40 Å, such as about 20 Å. In the third region 306 the remainder of the opening after deposition of the glue layer 603 may have a third width $W_3$ of between about 10 Å and about 40 Å, such as about 15 Å.

Additionally, because of the differing number of layers in each of the first region 302, the second region 304, and the third region 306, the openings may each have a different height during deposition of the fill material 605. For example, in the first region 302 the remainder of the opening after deposition of the glue layer 603 may have a first height $H_1$ of between about 60 nm and about 100 nm, such as about 80 nm. Similarly, in the second region 304 the remainder of the opening after deposition of the glue layer 603 may have a second height $H_2$ of between about 60 nm and about 100 nm, such as about 80 nm. In the third region 306 the remainder of the opening after deposition of the glue layer 603 may have a third height $H_3$ of between about 60 nm and about 80 nm, such as about 100 nm.

In an embodiment the fill material 605 may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 605 may be deposited to a thickness of between about 1000 Å and about 2000 Å, such as about 1500 Å. However, any suitable material may be utilized.

However, by utilizing the embodiments described herein, the aspect ratios (e.g., ratio of the height to the width) of each of the openings may be kept small enough to not inhibit the deposition of the fill material 605. In particular, if the aspect ratio is too large, the deposition process of the fill material 605 may result in the formation of voids located within the fill material 605, which would lead to undesirable complications during further manufacturing or operation. However, by utilizing the thinner first capping layer 309 in the tuning of the various gate stacks, the aspect ratio can be kept lower, thereby leading to a reduction in the possibility of the formation of voids and their negative results.

Figure 9:
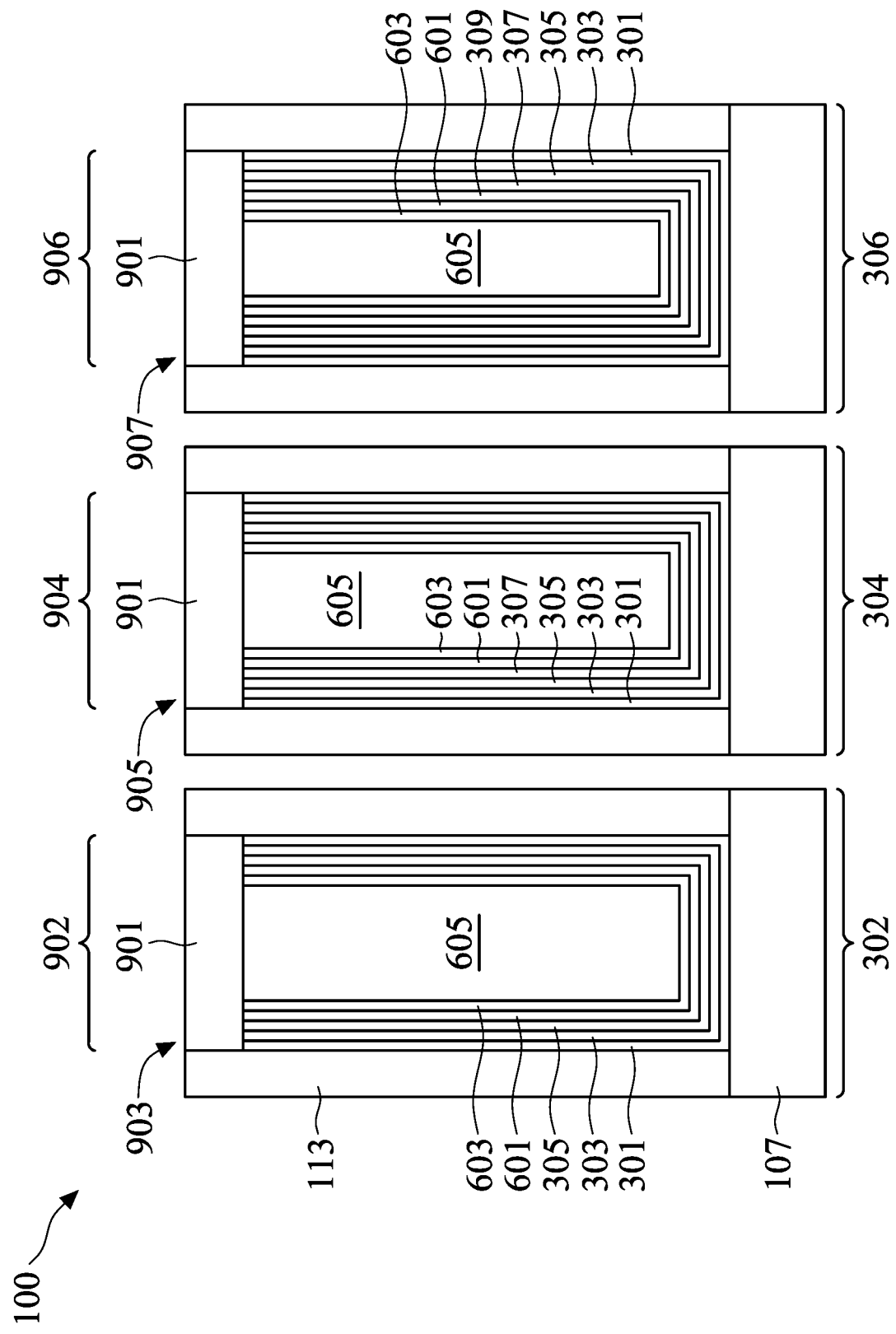
FIG. 9 illustrates a formation of a cap, in accordance with some embodiments.

FIG. 9 illustrates that, after the fill material 605 has been deposited to fill and overfill the opening, the materials within each of the openings of the first region 302, the second region 304, and the third region 306 may be planarized to form the first gate stack 902, the second gate stack 904, and the third gate stack 906. In an embodiment the materials may be planarized to be level with an upper surface of the first spacers 113 using, e.g., a chemical mechanical polishing process, although any suitable process, such as grinding or etching, may be utilized.

After the materials of the first gate stack 902, the second gate stack 904, and the third gate stack 906 have been formed and planarized, vertical portions of the materials of the first gate stack 902, the second gate stack 904, and the third gate stack 906 may be recessed and capped with a second capping layer 901. In an embodiment the materials of the first gate stack 902, the second gate stack 904, and the third gate stack 906 may be recessed using, e.g., a wet or dry etching process that utilizes etchants selective to the materials of the first gate stack 902, the second gate stack 904, and the third gate stack 906. In an embodiment the materials of the first gate stack 902, the second gate stack 904, and the third gate stack 906 may be recessed a distance of between about 5 nm and about 150 nm, such as about 120 nm. However, any suitable process and distance may be utilized.

Once the materials of the first gate stack 902, the second gate stack 904, and the third gate stack 906 have been recessed, the second capping layer 901 may be deposited and planarized with the first spacers 113. In an embodiment the second capping layer 901 is a material such as SiN, SiON, SiCON, SiC, SiOC, combinations of these, or the like, deposited using a deposition process such as atomic layer deposition, chemical vapor deposition, sputtering, or the like. The second capping layer 901 may be deposited to a thickness of between about 5 Å and about 200 Å, and then planarized using a planarization process such as chemical mechanical polishing such that the second capping layer 901 is planar with the first spacers 113.

By utilizing the embodiments described herein, multiple transistors with separately tuned threshold voltages can be achieved without a reduction in the various manufacturing process windows. For example, within the first region 302 a first transistor 903 may be formed with the first gate stack 902 which comprises the interfacial layer 301, the first dielectric material 303, the first metal material 305, the first n-metal work function layer 601, the glue layer 603, and the fill material 605. As such, for a first PMOS device, the first transistor 903 may have a first threshold voltage $V_{t1}$.

Similarly, within the second region 304, a second transistor 905 may be formed with the second gate stack 904 which comprises the interfacial layer 301, the first dielectric material 303, the first metal material 305, the first p-metal work function layer 307, the first n-metal work function layer 601, the glue layer 603, and the fill material 605. As such, for a second PMOS device, the second transistor 905 may have a second threshold voltage $V_{t2}$.

Additionally, within the third region 306, a third transistor 907 may be formed with the third gate stack 906 which comprises the interfacial layer 301, the first dielectric material 303, the first metal material 305, the first p-metal work function layer 307, the first capping layer 309, the first n-metal work function layer 601, the glue layer 603, and the fill material 605. As such, for a third PMOS device, the third transistor 907 may have a third threshold voltage $V_{t3}$.

Each of the first threshold voltage $V_{t1}$, second threshold voltage $V_{t2}$, and third threshold voltage $V_{t3}$, are different from each other and are separated by respective voltage differences. The first threshold voltage $V_{t1}$ is determined by the materials and thicknesses of the materials of the first gate stack 902, including the n-metal work function layer 601. The second threshold voltage $V_{t2}$ is differentiated from the first threshold voltage $V_{t1}$ by including the p-metal work function layer 307 in the second gate stack 904. The second threshold voltage $V_{t2}$ may have a value between about 0.1 V to about 0.4 V greater than $V_{t1}$. In other words, $V_{t2}=V_{t1}+Vt_{diff1}$, where $Vt_{diff1}$ is between about 0.1 V and about 0.4 V. The third threshold voltage $V_{t3}$ is differentiated from the second threshold voltage $V_{t2}$ by further including the first capping layer 309 in the third gate stack 906. The third threshold voltage $V_{t3}$ may have a value between about 0.1 V to about 0.4 V greater than $V_{t2}$. In other words, $V_{t3}=V_{t2}+Vt_{diff2}$, where $Vt_{diff2}$ is between about 0.1 V and about 0.4 V. $V_{t3}$ can also be written in terms of $V_{t1}$ as follows, $V_{t3}=V_{t1}+Vt_{diff1}+Vt_{diff2}$. It should also be noted that $V_{t1}<V_{t2}<V_{t3}$.

As an example illustration without any limitation, if $V_{t1}=0.1$ V, then $V_{t2}$ may be between about 0.2 V and about 0.5 V and $V_{t3}$ may be between about 0.3 V and about 0.9 V (while $V_{t1}<V_{t2}<V_{t3}$). As a second example illustration without any limitation, if $V_{t1}$=0.2 V, then $V_{t2}$ may be between about 0.3 V and about 0.6 V and $V_{t3}$ may be between about 0.4 V and about 1.0 V (while $V_{t1}<V_{t2}<V_{t3}$). As a third example illustration without any limitation, if $V_{t1}$=0.3 V, then $V_{t2}$ may be between about 0.4 V and about 0.7 V and $V_{t3}$ may be between about 0.5 V and about 1.1 V (while $V_{t1}<V_{t2}<V_{t3}$). As a fourth example illustration without any limitation, if $V_{t1}$=0.4 V, then $V_{t2}$ may be between about 0.5 V and about 0.8 V and $V_{t3}$ may be between about 0.6 V and about 1.2 V (while $V_{t1}<V_{t2}<V_{t3}$). As a fifth example illustration without any limitation, if $V_{t1}$=0.5 V, then $V_{t2}$ may be between about 0.6 V and about 0.9 V and $V_{t3}$ may be between about 0.7 V and about 1.3 V (while $V_{t1}<V_{t2}<V_{t3}$). Other example illustrations are readily apparent given these examples. One of skill will understand that the specific threshold voltage in each region depends on the thicknesses and materials of the various work function layers. As noted above, the first threshold voltage $V_{t1}$ in the first region 302 is greater than the second threshold voltage $V_{t2}$ in the second region 304 and the second threshold voltage $V_{t2}$ in the second region 304 is greater than the third threshold voltage $V_{t3}$ in the third region.

In other embodiments any of the first transistor 903, the second transistor 905, or third transistor 907 may be for NMOS devices and may have threshold voltages $V_{t1}$, $V_{t2}$, and $V_{t3}$, respectively, which may each have the same or different values than the PMOS threshold voltages discussed above. The voltage differences for $V_{t1}$, $V_{t2}$, and $V_{t3}$ in an NMOS device may be described as indicated above with PMOS devices. In other words, $V_{t2}=V_{t1}+Vt_{diff1}$, where $Vt_{diff1}$ is between about 0.1 V and about 0.4 V. $V_{t3}=V_{t2}+Vt_{diff2}$, where $Vt_{diff2}$ is between about 0.1 V and about 0.4 V. $V_{t3}$ can also be written in terms of $V_{t1}$ as follows, $V_{t3}=V_{t1}+Vt_{diff1}+Vt_{diff2}$. PMOS and NMOS devices may be combined such that semiconductor device 100 may have a combination of PMOS and NMOS devices, each having distinct threshold voltages. For example, the first transistor 903, the second transistor 905, and the third transistor 907 may be for PMOS devices and another set of transistors similar to the first transistor 903, the second transistor 905, and the third transistor 907 may be for NMOS devices.

By utilizing the embodiments described herein, multiple different materials and a thin capping layer are utilized in order to tune the threshold voltages of the devices. By utilizing multiple different metals and the thin capping layer, a stacking of multiple layers of the same material (e.g., TiN) may be avoided, and an overall reduction in thickness may be achieved than with the same material by itself. As such, the total thickness of the layers may be reduced, which increases the gap-fill window for lower costs to form subsequent layers. Such a reduction further allows for a better threshold stability as fewer voids will be formed and the metal gate can completely fill the openings. As such, multiple threshold voltage tuning can be achieved in a much narrower critical dimension (e.g., for 5 nm and 3 nm technology nodes) without sacrificing the N/P patterning and metal gate gap-fill windows.

In an embodiment, a method includes depositing a gate dielectric over a first region, a second region, and a third region. A first metal material is deposited over the first region, the second region, and the third region. A first work function layer is deposited over the first region, the second region, and the third region. A first capping layer is formed over the first region, the second region, and the third region on the first work function layer, the first capping layer including an insulating material. The first capping layer is removed from the second region and the first capping layer and the first work function layer are removed from the first region. A fill material is deposited over the first region, the second region, and the third region after removing the first work function layer from the first region. In an embodiment, the method includes that the first work function layer includes tungsten, tungsten oxide, tungsten nitride, molybdenum, or molybdenum nitride. In an embodiment, the method includes that the first capping layer includes silicon oxide or silicon nitride. In an embodiment, the method includes that forming the first capping layer includes performing a silicon-based gas soak to deposit a silicon-based dielectric. In an embodiment, the method includes that forming the first capping layer further comprises breaking vacuum in a processing chamber, thereby oxidizing a silicon layer formed by the silicon-based gas soak. In an embodiment, the method further includes planarizing the fill material, recessing vertical portions of the first metal material, the first work function layer, the first capping layer, and the fill material, forming a second capping layer over the first region, the second region, and the third region, and planarizing the second capping layer. In an embodiment, the includes that a thickness of the first capping layer is less than 50% a thickness of the first work function layer in the third region. In an embodiment, the method further includes, prior to depositing the fill material, depositing a second work function layer over the first region, the second region, and the third region, and depositing a glue layer over the first region, the second region, and the third region.

In another embodiment, a method includes forming first gate materials of a first gate stack in a first device region, where forming the first gate materials includes depositing a gate dielectric over the first device region; depositing a barrier layer over the first device region; depositing a first work function layer over the first device region; forming a first capping layer over the first device region on the first work function layer, the first capping layer including a silicon-based dielectric material; and forming a second work function layer over the first capping layer in the first device region. A fill material is deposited over the first device region, where the first gate stack forms a first transistor having a first threshold voltage. In an embodiment, the method further includes forming second gate materials of a second gate stack in a second device region, where forming the second gate materials is performed according to the forming of the first gate materials; masking the first gate materials; tuning a second threshold voltage corresponding to a second transistor formed from the second gate stack by removing the first capping layer in the second device region; unmasking the first gate materials; forming the second work function layer over the first work function layer in the second device region; and depositing the fill material over the second device region, where the second threshold voltage is different than the first threshold voltage. In an embodiment, the method further includes forming third gate materials of a third gate stack in a third device region, where forming the third gate materials is performed according to the forming of the first gate materials; masking the first gate materials and the second gate materials; tuning a third threshold voltage corresponding to a third transistor formed from the third gate stack by removing the first capping layer and the first work function layer in the third device region; unmasking the first gate materials and the second gate materials; forming the second work function layer over the barrier layer in the third device region; and depositing the fill material over the third device region, where the third threshold voltage is different than the first threshold voltage and the second threshold voltage. In an embodiment, the method includes that the barrier layer includes tantalum nitride. In an embodiment, the method includes that forming the first capping layer comprises: soaking the first device region in a silicon-based gas to form a silicon layer, and breaking vacuum in a processing chamber, thereby oxidizing the silicon layer into silicon oxide. In an embodiment, the method includes that the forming the first gate materials includes: depositing an interfacial layer over a semiconductor fin; and depositing a second capping layer over the interfacial layer. In an embodiment, the method includes depositing a glue layer over the second work function layer. In an embodiment, the method includes that the first capping layer has a thickness which is less than half a thickness of the first work function layer.

In yet another embodiment, a semiconductor device includes a first gate stack over a first semiconductor fin, the first gate stack including a first metal material; a second gate stack over a second semiconductor fin, the second gate stack including the first metal material and a first p-metal material different from the first metal material on the first metal material; and a third gate stack over a third semiconductor fin, the third gate stack including the first metal material, the first p-metal material, and a first dielectric capping layer. Each of the first gate stack, the second gate stack, and the third gate stack includes an n-metal material, the n-metal material in the first gate stack being in physical contact with the first metal material, the n-metal material in the second gate stack being in physical contact with the first p-metal material, and the n-metal material in the third gate stack being in physical contact with the first dielectric capping layer. In an embodiment, the first p-metal material includes tungsten, tungsten oxide, tungsten nitride, molybdenum, or molybdenum nitride. In an embodiment, the first dielectric capping layer includes a silicon-based material. In an embodiment, each of the first gate stack, the second gate stack, and the third gate stack respectively includes a metal fill over the n-metal material, the metal fill being free of voids. In an embodiment, each of the first gate stack, the second gate stack, and the third gate stack respectively includes a glue layer interposed between the respective n-metal material and metal fill. In an embodiment, the first dielectric capping layer has a thickness which is between 10% and 80% of a thickness of the first p-metal material function layer.

Another embodiment is a device including a first gate stack over a first semiconductor fin, the first gate stack tuned to have a first threshold voltage. The semiconductor device also includes a second gate stack over a second semiconductor fin, the second gate stack tuned to have a second threshold voltage different than the first threshold voltage. The semiconductor device also includes a third gate stack over a third semiconductor fin, the third gate stack including a first metal layer, a second metal layer over the first metal layer, a first dielectric layer over the second metal layer, and a metal fill over the first dielectric layer, the third gate stack tuned to have a third threshold voltage, the third threshold voltage different from the second threshold voltage and the first threshold voltage. In an embodiment, the semiconductor device further includes a third metal layer, the third metal layer interposed between the first dielectric layer and the metal fill. In an embodiment, the semiconductor device further includes a glue layer, the glue layer interposed between the third metal layer and the metal fill. In an embodiment, the second metal layer includes tungsten, tungsten oxide, tungsten nitride, molybdenum, or molybdenum nitride. In an embodiment, the first dielectric layer includes silicon oxide or silicon nitride. In an embodiment, a thickness of the first dielectric layer is less than 50% a thickness of the second metal layer. In an embodiment, the first gate stack, second gate stack, and third gate stack each have a different number of material layers.

Another embodiment is a device including a first gate stack over a first semiconductor fin, the first gate stack including a first metallic layer. The semiconductor device also includes a second gate stack over a second semiconductor fin, the second gate stack including the first metallic layer and a second metallic layer over the first metallic layer, the second metallic layer being different from the first metallic layer. The semiconductor device also includes a third gate stack over a third semiconductor fin, the third gate stack including the first metallic layer, the second metallic layer, and a first dielectric layer over the second metallic layer. In an embodiment, the second metallic layer includes tungsten, tungsten oxide, tungsten nitride, molybdenum, or molybdenum nitride. In an embodiment, the first dielectric layer includes a silicon-based material. In an embodiment, each of the first gate stack, the second gate stack, and the third gate stack each includes a third metallic layer. In an embodiment, each of the respective third metallic layers of the first gate stack, the second gate stack, and the third gate stack contacts the first metallic layer in the first gate stack, the second metallic layer in the second gate stack, and the first dielectric layer in the third gate stack. In an embodiment, each of the first gate stack, the second gate stack, and the third gate stack each includes a metallic fill over the third metallic layer. In an embodiment, the first dielectric layer has a thickness which is between 10% and 80% of a thickness of the second metallic layer.

Another embodiment is a method including depositing a first gate dielectric over a first channel region of a first transistor. The method also includes depositing a first work function layer over the first gate dielectric. The method also includes forming a first capping layer over the first work function layer, the first capping layer including silicon oxide or silicon nitride. The method also includes depositing a second work function layer over the first capping layer. The method also includes depositing a fill material over the second work function layer. In an embodiment, forming the first capping layer includes soaking the first work function layer in a silicon-based gas to form a silicon layer over the first work function layer, and breaking vacuum in a processing chamber, thereby oxidizing the silicon layer into silicon oxide. In an embodiment, forming the first capping layer includes soaking the first work function layer in a silicon-based gas and a nitrogen-based gas to form a silicon nitride layer over the first work function layer. In an embodiment, the method further includes depositing the first gate dielectric, the first work function layer, and the first capping layer over a second channel region of a second transistor and over a third channel region of a third transistor; masking the first capping layer over the first channel region and removing the first capping layer from the second channel region and from the third channel region; and masking the first capping layer over the first channel region, masking the first work function layer over the second channel region, and removing the first work function layer from the third channel region. In an embodiment, the method further includes depositing the second work function layer over the first gate dielectric in the first channel region and over the first work function layer in the second channel region; depositing the fill material over the second work function layer; and planarizing upper surfaces of the first gate dielectric, the first work function layer, the first capping layer, and the fill material to level the upper surfaces to each other. In an embodiment, the first capping layer has a thickness which is less than half a thickness of the first work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first gate stack over a first semiconductor fin, the first gate stack tuned to have a first threshold voltage, and comprising a first region of a gate dielectric material, a first region of an n-metal work function material, and a first region of metallic barrier material interjacent the first region of the n-metal work function material and the first region of the gate dielectric material;
   a second gate stack over a second semiconductor fin, the second gate stack tuned to have a second threshold voltage different than the first threshold voltage, and comprising a second region of the gate dielectric material, a first region of a p-metal work function material, a second region of the metallic barrier material interjacent the first region of the p-metal work function material and the second region of gate dielectric, and a second region of the n-metal work function material overlying the first region of p-metal work function material; and
   a third gate stack over a third semiconductor fin, the third gate stack comprising a third region of the gate dielectric material, a second region of the p-metal work function material, a third region of the metallic barrier material interjacent the second region of the p-metal work function material and the third region of the gate dielectric material, a second region of the n-metal work function material overlying the second region of the p-metal work function material, and a dielectric material interjacent the third region of the n-metal work function material and the second region of the p-metal work function material, and a metal fill over the dielectric material, the third gate stack tuned to have a third threshold voltage, the third threshold voltage different from the second threshold voltage and the first threshold voltage.

2. The semiconductor device of claim 1, further comprising:
   an interfacial material interjacent the first region of gate dielectric material and an underlying channel region.

3. The semiconductor device of claim 2, further comprising:
   a glue layer, the glue layer interposed between the third region of the n-metal work function material and the metal fill.

4. The semiconductor device of claim 1, wherein the p-metal work function material is a material selected from the group consisting of tungsten, tungsten oxide, tungsten nitride, molybdenum, and molybdenum nitride.

5. The semiconductor device of claim 1, wherein the dielectric material comprises silicon oxide or silicon nitride.

6. The semiconductor device of claim 1, wherein a thickness of the dielectric material is less than 50% a thickness of the p-metal work function material.

7. The semiconductor device of claim 1, wherein the first gate stack, second gate stack, and third gate stack respectively have a different number of material layers.

8. A semiconductor device comprising:
   a first gate stack over a first semiconductor fin, the first gate stack comprising a first metallic layer;
   a second gate stack over a second semiconductor fin, the second gate stack comprising the first metallic layer and a second metallic layer over the first metallic layer, the second metallic layer being different from the first metallic layer; and
   a third gate stack over a third semiconductor fin, the third gate stack comprising the first metallic layer, the second metallic layer, and a first dielectric layer over the second metallic layer; and
   a third metallic layer contacting the first metallic layer in the first gate stack, contacting the second metallic layer in the second gate stack, and contacting the first dielectric layer in the third gate stack.

9. The semiconductor device of claim 8, wherein the second metallic layer comprises tungsten, tungsten oxide, tungsten nitride, molybdenum, or molybdenum nitride.

10. The semiconductor device of claim 8, wherein the first dielectric layer comprises silicon-based material.

11. The semiconductor device of claim 8, wherein the third metallic layer is an n-metal work function material.

12. The semiconductor device of claim 11, wherein the first metallic layer is tantalum nitride.

13. The semiconductor device of claim 11, wherein each of the first gate stack, the second gate stack, and the third gate stack comprises a metallic fill over the third metallic layer.

14. The semiconductor device of claim 8, wherein the first dielectric layer has a thickness which is between 10% and 80% of a thickness of the second metallic layer.

15. A semiconductor device comprising:
   a discontinuous layer of gate dielectric material having a first portion extending over a first channel region, a second portion extending over a second channel region, and a third portion extending over a third channel region;
   a discontinuous layer of p-metal work function material having a first portion extending over the first channel region, and a second portion extending over the second channel region, the discontinuous layer of p-metal work function material being absent over the third channel region;
   a discontinuous layer of metallic barrier material, having a first portion extending over the first channel region and interjacent the first portion of the discontinuous layer of gate dielectric material and the first portion of the p-metal work function material, and a second portion extending over the second channel region and being and interjacent the second portion of the discontinuous layer of gate dielectric material and the second portion of the p-metal work function material, and a third portion extending over the third channel region;
   a discontinuous layer of n-metal work function material having a first portion extending over the first channel region, a second portion extending over the second channel region, and a third portion over the third channel region, wherein the third portion of the discontinuous layer of metallic barrier material is interjacent the third portion of the discontinuous layer of gate dielectric material and the third portion of the discontinuous layer of n-metal work function material; and a capping layer extending over the first channel region, the capping layer being interjacent the first portion of the discontinuous layer of p-metal work function material and the first portion of the discontinuous layer of n-metal work function material, the capping layer being absent over the second channel region and the third channel region.

16. The semiconductor device of claim 15, further comprising a discontinuous layer of interface material having a first portion interjacent the first channel region and the first portion of gate dielectric material, a second portion interjacent the second channel region and the second portion of gate dielectric material, and a third portion interjacent the third channel region and the third portion of gate dielectric material.

17. The semiconductor device of claim 15, further comprising a metallic fill material overlying the first portion, the second portion, and the third portion of the discontinuous layer of n-metal work function material.

18. The semiconductor device of claim 15, wherein the p-metal work function material is selected from the group consisting of tungsten, tungsten oxide, tungsten nitride, molybdenum, or molybdenum nitride.

19. The semiconductor device of claim 15, wherein the capping layer comprises a material selected from the group consisting of silicon oxide and silicon nitride.

20. The semiconductor device of claim 15, wherein the first channel region and the second channel region are both located within a common fin structure.

* * * * *